United States Patent [19]

Cavallotti et al.

[11] Patent Number: 5,053,984
[45] Date of Patent: Oct. 1, 1991

[54] MEMORY FOR PROGRAMMABLE DIGITAL FILTER

[75] Inventors: Franco Cavallotti, Turin; Alessandro Cremonesi, Angelo Lodigiano; Rinaldo Poluzzi, Milan, all of Italy

[73] Assignee: SGS Thomson Microelectronics S.R.L., Brianza, Italy

[21] Appl. No.: 440,021

[22] Filed: Nov. 21, 1989

[51] Int. Cl.[5] .............................................. G06F 15/31
[52] U.S. Cl. ............................................... 364/724.16
[58] Field of Search ....................... 364/724.16, 724.01

[56] References Cited

U.S. PATENT DOCUMENTS

| | | | |
|---|---|---|---|
| 4,709,343 | 11/1987 | Van Cang | 364/724.01 |
| 4,809,205 | 2/1989 | Freeman | 364/721 |
| 4,811,262 | 3/1989 | White | 364/724.01 |

*Primary Examiner*—Dale M. Shaw
*Assistant Examiner*—Tan V. Mai
*Attorney, Agent, or Firm*—Wolf, Greenfield & Sacks

[57] ABSTRACT

The filter includes an arithmetical chain of parallel adders alternated with delay elements, and a memory constituted by lines of one-bit cells. Each line is addressable by a decoder controlled by a digital signal to be filtered; each line of memory contains side by side values which correspond to the partial products of successive impulse-response coefficients for a value equal to the line address. The memory additionally includes a number of read amplifiers. The number of read amplifiers is equal to the number of cells of one line in order to read the bits of the addressed. The outputs of the amplifiers are connected to respective parallel inputs of the adders of the arithmetical chain. Each memory line contains these values in two's-complement binary form in words which decrease in length by one bit for each increment of 2 in the characteristic of the coefficients, starting from the one of lowest characteristic. The output of each read amplifier corresponding to the most significant bit of each value is connected to the corresponding input bit line of the associated adder and to all the other most significant input bit lines.

1 Claim, 2 Drawing Sheets

MEMORY FOR PROGRAMMABLE DIGITAL FILTER

BACKGROUND OF THE INVENTION

The present invention relates to a memory for programmable digital filter for wide-band electronic signals, particularly video signals.

PRIOR ART

More particularly the invention relates to an EPROM memory which can be used to implement a digital filter of the non-recursive type with finite impulse response (FIR) of the kind described in the antedated patent application No. 22890-A/88 in the name of the same Applicant, entitled "Programmable Digital Filter", filed on Dec. 6, 1988.

Said antedated patent relates to a digital filter of the kind with a transposed canonical structure, wherein an array of multipliers provides partial products of the digital signal to be filtered by successive coefficients of the filter's impulse response. The antedated patent replaces said multipliers with tables of pre-calculated partial products contained in one or more re-programmable memories, and each memory cell contains the partial product of an associated stage which corresponds to the value to be processed which coincides with the address of said cell. In particular, said antedated patent uses a single memory which contains, in each line, all the partial products between the address of that line and all the coefficients from $h_0$ to $h_T$, T being the overall number of coefficients of the filter. The line is transmitted in parallel to the arithmetical block of the filter by means of a bank of read amplifiers which are equal in number to the length of the memory line.

However, though the use of a table thus defined instead of multipliers offers advantages in terms of operating speed, simplicity of implementation etc., as the precision of the coefficients of the filter rises, the dimensions of the memory also grow in a linear manner together with the number of read amplifiers, with an increase in silicon area occupation and with a consequent limitation of the performance obtainable from a filter integrated according to a given technology.

SUMMARY OF THE INVENTION

The aim of the invention is to provide a programmable digital filter which has the tabular memory architecture described in said antedated patent application, which requires a smaller memory capacity than said prior filter for an equal equivalent output dynamics and with no complications in the circuits associated with the memory. In a typical application, a digital filter according to the present invention provides in output an equivalent dynamics of 20 word bits with a memory size which would allow a dynamics of only 16 bits in said antedated patent application.

Together with the reduction in memory size and therefore in the occupied silicon area, the invention also provides an increase in the filter's processing speed (as required, for example, for video applications) for an equal dynamics, or an increase in dynamics with unchanged speed.

The invention achieves the above mentioned aim and other objects and advantages such as will become apparent from the continuation of the description with a programmable digital filter which comprises an arithmetical chain of parallel adders alternated with delay elements, and a memory constituted by a plurality of lines of a plurality of one-bit cells, each being addressable by a decoder controlled by a digital signal to be filtered, each memory line containing side by side values corresponding to the partial products of successive impulse response coefficients for a value equal to the line address, said memory furthermore comprising a number of read amplifiers which is equal to the number of cells of one line in order to read the bits of the addressed line, the outputs of said amplifiers being connected to respective parallel inputs of the adders of said arithmetical chain, characterized in that each memory line contains said values in two's-complement binary form in words which decrease in length by one bit for each increment of 2 in the characteristic of said coefficients, starting from the one with lowest characteristic, and in that the output of each read amplifier corresponding to the most significant bit of each value is connected to the corresponding input bit line of the associated adder and to all the other most significant input bit lines.

BRIEF DESCRIPTION OF THE DRAWINGS

The invention is now described in greater detail with reference to a preferred embodiment thereof, illustrated in the accompanying drawings and given only by way of non-limitative example, wherein.

DETAILED DESCRIPTION OF THE PREFERRED EMBODIMENTS

Figure 1:
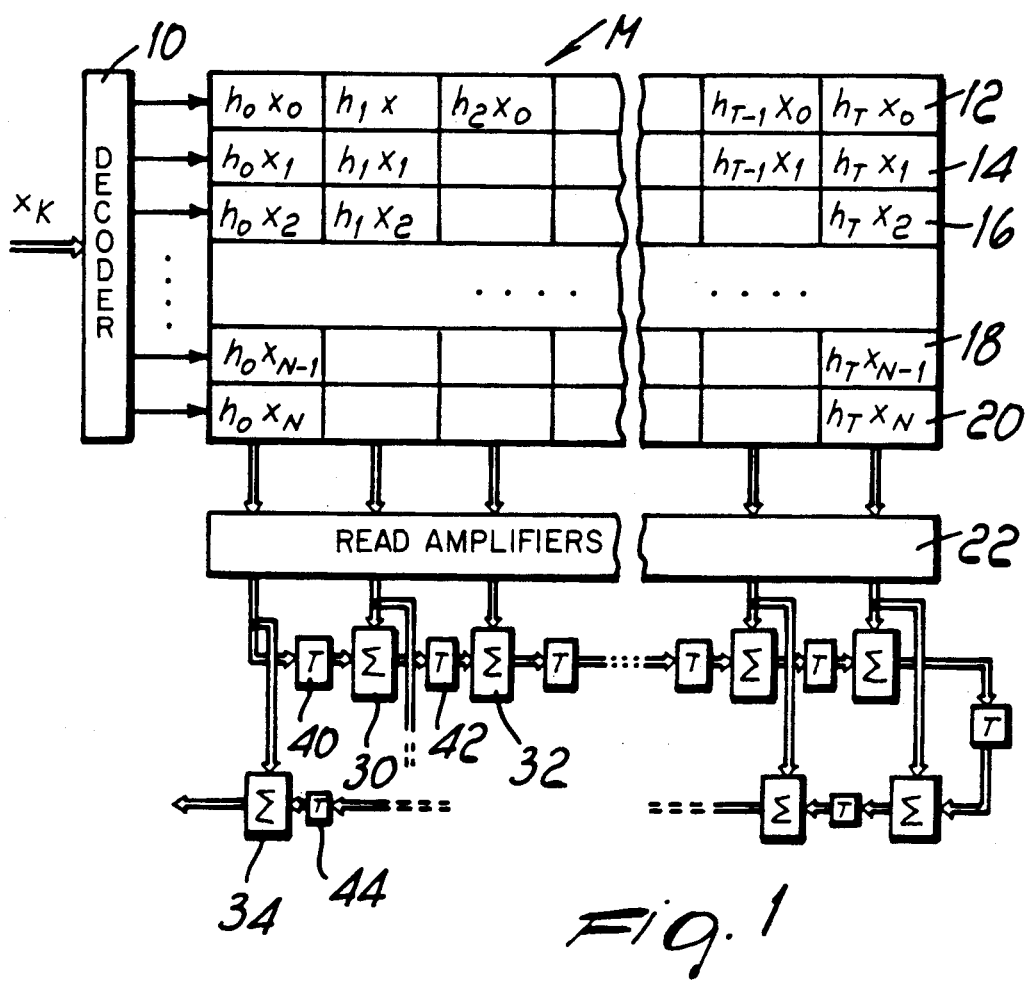
FIG. 1 is conceptual block circuit diagram of a programmable FIR digital filter according to said antedated patent application.

FIG. 1 is the block circuit diagram of a digital FIR filter with transposed structure according to the teachings of the above mentioned antedated patent application in the name of the same Applicant, No. 22890-A/88 entitled "Programmable digital filter". The samples $x_k$ of the input signal are fed, with the clock's timing, to a decoder 10 adapted to convert the input word into the selection of one of a plurality of lines 12, 14, 16, ..., 18, 20 of cells of a memory M. The memory has read amplifiers 22 with a number of channels equal to the number of cells which constitute one line; said amplifiers are adapted to allow, in a known manner, the reading of a required memory line.

Each line of cells of the memory M comprises a plurality of one-bit cells which store in succession the products of progressive coefficients $h_0, h_1, h_2, \ldots, h_T$ for a value which corresponds to the address of said line. Thus, when a sample $x_i$ to be processed is applied to the decoder, the line with address $x_i$ will be excited and the output amplifiers will provide the products $h_0 x_i, h_1 x_i, h_2 x_i, \ldots, h_T x_i$.

The outputs of the amplifiers are applied in a known manner to respective first parallel inputs of an array of adders 30, 32, ..., 34, and each adder (starting from the one with lowest characteristic) receives on its second input the output of the preceding adder via a respective delay element 40, 42, ..., 44; all of said delay elements have an identical delay T which is equal to a clock period.

In this manner, the time required to generate each individual partial product is constant and independent from the characteristics of the operands, and is shorter than the time required by the multipliers used in the circuit of FIG. 1. The products can furthermore be obtained with arbitrary precision, while any rounding or truncation is performed only on the final result.

For a number T of coefficients and an input dynamics of N bits, the filter of the above described kind requires a memory of the following size:

$$2^N \times T \times b,$$

where b is the number of bits assigned to the product of the input datum and the coefficient h of the impulse response. Since the described structure requires the transfer of all said products to the arithmetical unit in parallel, $T \times b$ read amplifier lines, divided into T buses of b lines, are required.

In order to reduce the number of memory cells and therefore the silicon area, as well as the number of read amplifiers, the invention started from the observation that in a typical video filter with a band 0.25-0.50 times the value of the sampling frequency a repetitive decay occurs in passing from one coefficient to the other.

Figure 2:
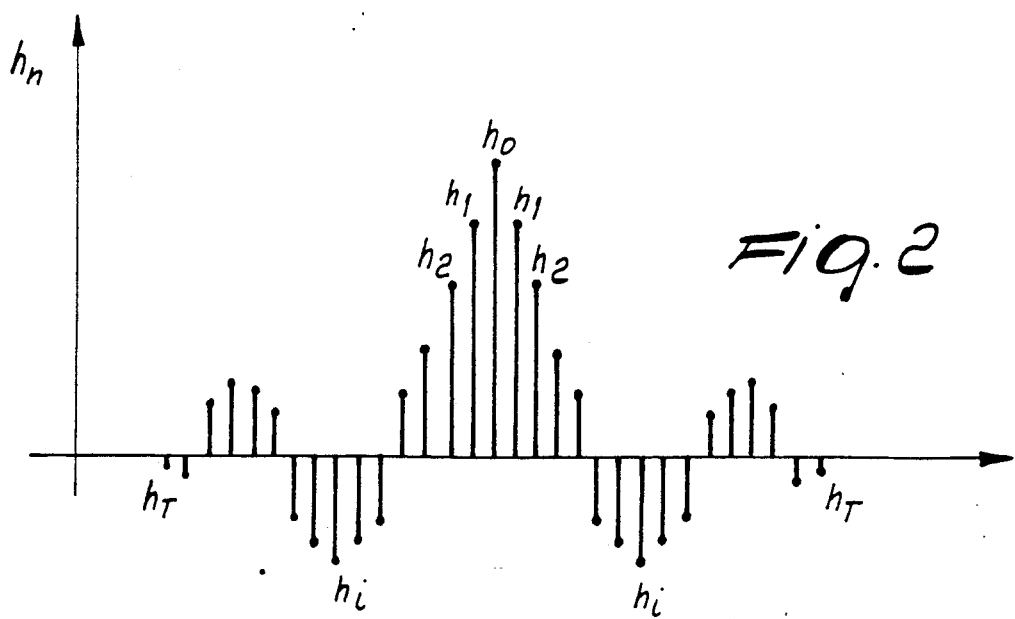
FIG. 2 is a plot of the amplitudes of the successive multiplication coefficients from the lowest characteristic to the highest one by which the sampled signal must be multiplied in order to generate the partial products to be added in the arithmetical unit of an FIR filter with transposed canonical structure.

With reference to FIG. 2, which plots the amplitude of the successive coefficients $h_i$ of i-th impulse response, the following decay can be observed starting from the central coefficient $h_0$:

a) $h_1/h_0 < 0.5$
b) $h_{i+1}/h_i < 0.7$ (for $i > 0$).

This means that the binary representation of the coefficient loses one significant bit for every 2 increment coefficients in the sequence $h_0, h_1, h_2, \ldots, h_T$ for $i > 0$.

According to the invention, a filter is thus provided which still has the same basic architecture as FIG. 1 but has successive partial products in each line contained in variable-length words, i.e.:

---
a number $b_0$ of bits for the central coefficient;
a number $b_0 - 1$ of bits for the coefficients $h_1$ and $h_2$;
a number $b_0 - 2$ of bits for the coefficients $h_3$ and $h_4$;
...
a number $b_0 - T/2$ of bits for the last coefficient (where T/2 is rounded down to the nearest integer if T is odd).

---

Figure 3:
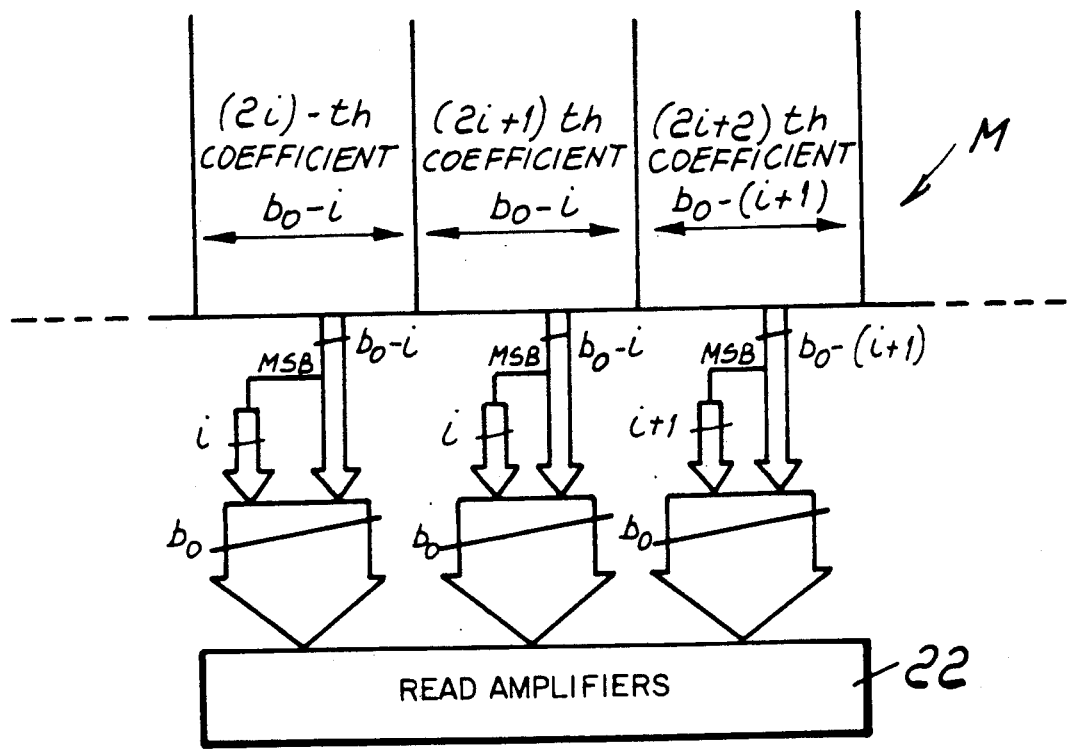
FIG. 3 is a detail diagram of the connection between the read amplifier and the adder in a filter according to the invention.

Since the circuits which are external to the memory (adders, delay elements, and other registers) assume words of uniform length, it is then necessary to expand the shortened words upon their exit from memory, inserting the bits which had been eliminated therefrom. Choosing a two's-complement representation of the partial products, it is sufficient to replicate the most significant bit of the word as many times as is required to return the word to the standard length, as illustrated in the partial diagram of FIG. 3.

The number of total non-zero bits required is:

$$N_b = b_o + 2(b_o - 1) + 2(b_o - 2) + \ldots + 2(b_o - T/2)$$

where $b_o$ is the precision of the central coefficient. This relationship is reduced to $$N_b = b_o T - T^2/4.$$

This means that if the words are stored with variable lengths, eliminating the redundant bits, a saving of $T^2/4$ one-bit cells for each line is achieved, giving a total of $2^N \times T^2/4$ on the entire memory of $2^N$ lines. A number $T^2/4$ of read amplifiers is also saved.

In a typical application with 16 coefficients, 20-bit dynamics and with N=8, the total memory required is, according to the given equations:

$$2^N(b_o T - T^2/4) = 65,536 \text{ bits}$$

with a saving of 16,384 bits with respect to a standard memorization which would require 81,920 bits, therefore with a saving of approximately 25%. The saving of 64 amplifier units (320 to 256) must also be added to this.

It can thus be seen that it is possible to achieve a performance which corresponds to 20-bit arithmetics using a memory with an average length of 16 bits with a consequent reduction in area and dissipation.

Though the above described calculations are based on the assumption of an even number of coefficients, the saving would be of the same order even with an odd number of coefficients.

The concepts of the invention may furthermore be also applied to all the other embodiments of the filter as described in said antedated patent application, such as symmetrical ones with or without central coefficient, asymmetrical ones, etc.

The invention is applicable equally well to filters using EPROM, RAM or any other kind of memory.

We claim:

1. Programmable digital filter comprising an arithmetical chain of parallel adders alternated with delay elements, and a memory constituted by a plurality of lines of a plurality of one-bit cells, each being addressable by a decoder controlled by a digital signal to be filtered, each line of memory containing side by side values corresponding to the partial products of successive impulse response coefficients for a value equal to the line address, said memory furthermore comprising a number of read amplifiers equal to the number of cells of one line to read the bits of the addressed line, the outputs of said amplifiers being connected to respective parallel inputs of said adders of said arithmetical chain, characterized in that each memory line contains said values in two's-complement binary form in words which decrease in length by one bit for every increment of 2 in the characteristic of said coefficients starting from the one with lowest characteristic, and in that the output of each read amplifier corresponding to the most significant bit of each value is connected to the corresponding input bit of the associated adder and to all the other most significant input bits.

* * * * *